United States Patent [19]
Shiralagi

[11] Patent Number: 6,001,722
[45] Date of Patent: *Dec. 14, 1999

[54] SELECTIVE METALLIZATION/DEPOSITION FOR SEMICONDUCTOR DEVICES

[75] Inventor: Kumar Shiralagi, Chandler, Ariz.

[73] Assignee: Motorola, Inc., Schaumburg, Ill.

[ * ] Notice: This patent is subject to a terminal disclaimer.

[21] Appl. No.: 08/879,379

[22] Filed: Jun. 20, 1997

[51] Int. Cl.⁶ .................................................. H01L 21/205
[52] U.S. Cl. ........................... 438/606; 438/688; 438/681
[58] Field of Search .................. 438/604, 605, 438/606, 607, 608, 674, 681

[56] References Cited

U.S. PATENT DOCUMENTS

| | | | |
|---|---|---|---|
| 5,089,438 | 2/1992 | Katz | 438/604 |
| 5,232,869 | 8/1993 | Frigo et al. | 438/681 |
| 5,730,798 | 3/1998 | Shirlaagi | 438/689 |
| 5,756,154 | 5/1998 | Shiralagi et al. | 427/272 |
| 5,759,880 | 6/1998 | Shiralagi et al. | 438/184 |
| 5,788,747 | 8/1998 | Horiuchi et al. | 438/681 |
| 5,846,609 | 12/1998 | Shiralagi | 427/510 |
| 5,877,071 | 3/1999 | Shiralagi et al. | 438/492 |

*Primary Examiner*—Olik Chaudhuri
*Assistant Examiner*—Anh Duy Mai
*Attorney, Agent, or Firm*—Eugene A. Parsons; William E. Koch

[57] ABSTRACT

A method of selective metallization/deposition including patterning a mask on the surface of a substrate structure to define contact areas, and utilizing a compound, including a metal, which dissociates under predetermined conditions. The dissociation and application of the predetermined conditions occurring either during deposition or after deposition to selectively form a layer of the metal on the contact areas.

27 Claims, 3 Drawing Sheets

SELECTIVE METALLIZATION/DEPOSITION FOR SEMICONDUCTOR DEVICES

FIELD OF THE INVENTION

The present invention concerns methods of fabricating semiconductor devices. More specifically, the present invention pertains to metallization processes.

BACKGROUND OF THE INVENTION

In the fabrication of semiconductor devices, metallization processes are employed to form contacts. Currently, metallization is generally achieved by providing a patterned layer of resist material and depositing a blanket layer of the desired metal. Unwanted metal is then removed by dissolving the resist and lifting off the metal in a lift-off process. Thus, these prior art techniques involve many process steps such as resist spinning, exposure, developing, cleaning and so on. All of these processes can introduce contamination, decrease yield, etc. A further problem that arises is that the structure or substrate (generally a wafer) must be removed from the growth chamber to remove the masking material. The structure is then masked again and reintroduced into the growth chamber for re-growth. Thus, the prior art techniques keep the wafer vacuum incompatible.

A second method of removing unwanted metal is etching. This requires additional masking steps. During the etching and/or mask removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

In addition to the etching problems, all known prior art metallization processes require many interspersed deposition, masking and etching steps which greatly complicate and lengthen the process. For example, when epitaxial layer growth and metallization steps are interspersed, the wafers must be placed in a vacuum or pressure chamber to provide the atmosphere for the growth. However, each time the wafer must be etched and/or masked, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Accordingly, it would be highly desirable to provide fabrication methods for semiconductor devices with improved metallization processes.

It is a purpose of the present invention to provide new and improved methods of selective metallization during semiconductor device fabrication.

It is another purpose of the present invention to provide new and improved methods of selective metallization during the fabrication of semiconductor devices which does not require removal of the substrate from the processing chamber.

It is a further purpose of the present invention to provide methods of selective metallization which can be used in combination with resistless processes.

It is still a further purpose of the present invention to provide methods of selective metallization which can be used in semiconductor diffusion processes.

SUMMARY OF THE INVENTION

The above problems and others are at least partially solved and the above purposes and others are realized in a method of selective metallization/deposition including patterning a mask on the surface of a substrate structure to define areas, and selectively forming a metal on the areas.

An example includes utilizing a compound, including a metal, which dissociates under predetermined conditions, the dissociation and application of the predetermined conditions occurring either during deposition or after deposition to selectively form a layer of the metal on the contact areas.

BRIEF DESCRIPTION OF THE DRAWINGS

Referring to the drawings.

DESCRIPTION OF THE PREFERRED EMBODIMENTS

Figure 1:
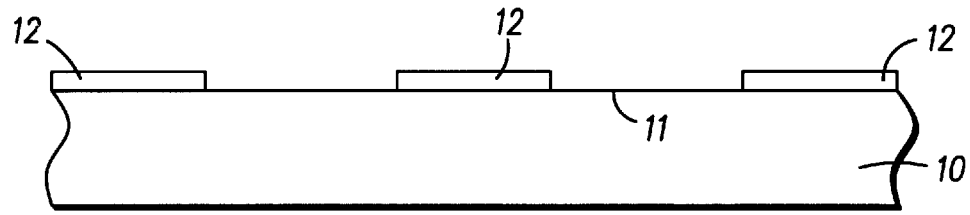
FIGS. 1 through 4 are simplified sectional views illustrating several sequential steps in a process in accordance with the present invention.

Turning now to FIGS. 1–4, sequential steps in a metallization process in accordance with the present invention are illustrated. Referring specifically to FIG. 1, a substrate structure 10 is provided. Substrate structure 10 can include a supporting substrate and one or more layers of material depending on the application. Semiconductor devices can be included in the substrate structure with the present metallization process forming contacts therefor or the metallization can be applied to an incomplete structure and used in further processing.

Still referring to FIG. 1, in this specific embodiment, substrate 10 has a surface 11 and is formed of gallium arsenide (GaAs), but it will be understood by those skilled in the art that other materials known in the art might be utilized. Generally, a thin layer of native oxide is present on surface 11 of substrate 10 if the substrate has been exposed to air. The layer of oxide is approximately 10 angstroms thick and forms on substrate 10 whenever it is exposed to air (ambient) for a short time.

In resistless process surface 11 of substrate 10 is patterned or otherwise covered with a mask 13 by any convenient method. Mask 13 may be simply a shadow or metal mask 13 or it can be formed in the well known manner with photolithography. In any case, mask is positioned on surface 11, or on the native oxide layer if it is present, so as to define one or more contact areas on surface 11 beneath mask 13 and one or more unmasked portions on surface 11 of substrate 10. In some special applications it may be possible to prevent the growth of the layer of native oxide on surface 11, in which case the following process is performed directly on surface 11.

An oxide mask layer 12 is grown on the unmasked portions of surface 11 and, as will be understood by those skilled in the art, will form with the native oxide as a portion thereof. In a preferred method of forming oxide mask layer 12, substrate 10 is exposed to an ultraviolet source in ambient conditions (air), i.e. no special chamber, etc., to expose the unmasked portions of substrate 10 to a combination of ultraviolet rays and/or ozone. The UV process grows a much thicker and denser layer of oxide (in the form of $Ga_2O_3$) than the native oxide. While other methods of growing oxide mask layer 12 may be devised and used, it should be understood that oxide mask layer 12 is formed sufficiently thicker and denser than the native oxide.

Once oxide mask layer 12 is grown, mask 13 is removed to expose the contact areas. Substrate 10 is then introduced into a growth chamber (not shown) and heated to desorb any native oxide that may be present in the contact areas. In the present example in which a gallium arsenide substrate is utilized, the substrate is heated in the growth chamber to approximately 580° C.–600° C. to desorb the native oxide in the exposed contact areas.

While the present process is referred to herein as a metallization/deposition process it should be understood that a thin layer of metal can be selectively deposited, as described herein, and the metal can then be heated to diffuse the metal atoms into the underlying layer (e.g. substrate structure 10) as a dopant. It is fully anticipated that such a method of doping or diffusion comes within the metallization/deposition descriptions herein.

Figure 2:
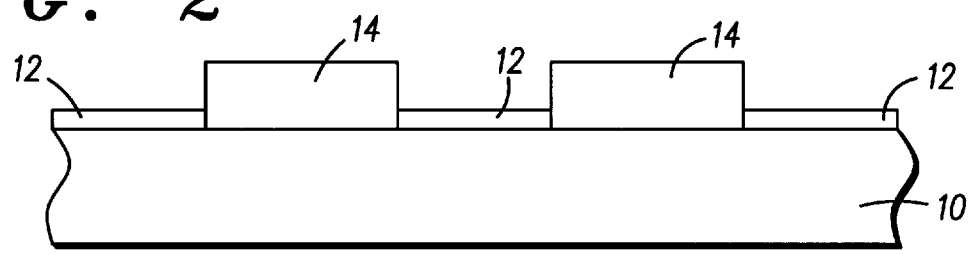

Turning now to FIG. 2, a layer 14 of a compound, including a metal, is selectively deposited on surface 11 on the contact areas. It should be understood that the term "selective deposition" refers to depositing material only on selected areas. The compound is characterized by dissociating under predetermined conditions which in this embodiment is a congruent sublimation temperature. The congruent sublimation temperature includes a temperature at which the compound dissociates so as to leave the metal while the other materials sublimate. For example when a III–V material system is used, the V material will sublimate leaving the III metal selectively on the contact areas. Typical examples of compounds which can be used include InAs, InP, InGaAs, and AlAs.

Figure 3:
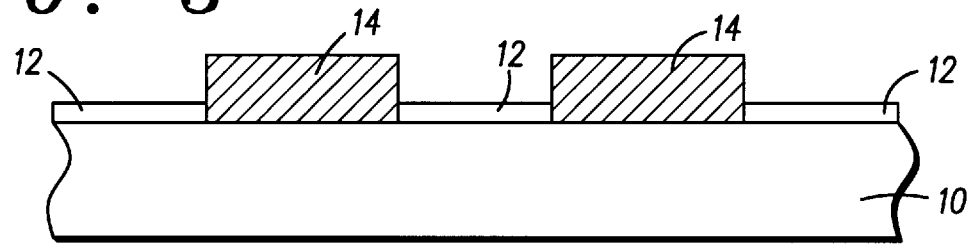

After deposition, the compound is heated to the congruent sublimation temperature. This dissociates the compound to selectively form a layer of the metal on the contact areas as shown in FIG. 3. It should be understood that dissociation of the compound begins at its exposed surfaces. Thus, the amount of layer 14 which is converted to metal depends on the length of time it is exposed to the congruent sublimation temperature. As specific examples, when the compound includes one of InAs, InGaAs and InP, the congruent sublimation temperature is greater than 420° C., and when the compound includes AlAs, the congruent sublimation temperature is greater than 930° C.

Figure 4:
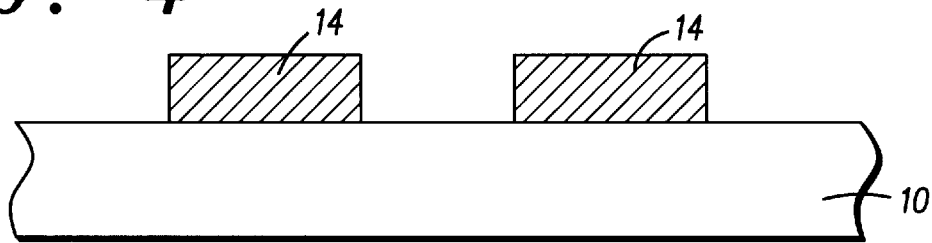

Turning now to FIG. 4, if the oxide mask 12 is not desorbed during the heating step, substrate 10 is heated to a higher temperature under high group V flux in the growth chamber to desorb oxide mask layer 12. In the present example in which the substrate is gallium arsenide, substrate 10 is heated to approximately 640° C. under high arsenic flux. The higher arsenic flux prevents gallium arsenide desorption during the desorption of oxide mask layer 12, resulting in the structure illustrated in FIG. 4. Thus, the present procedure can be used to form contacts in situ, which can be incorporated in a self aligned contact process and is very useful in the fabrication of many semiconductor devices such as an HFET with InAs source and drain.

Figure 5:
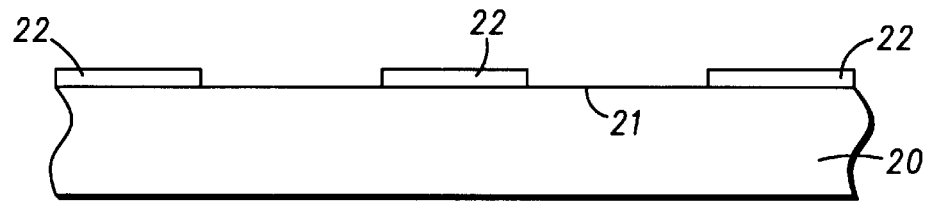
FIGS. 5 through 8 are simplified sectional views illustrating several sequential steps in another process in accordance with the present invention.
Figure 6:
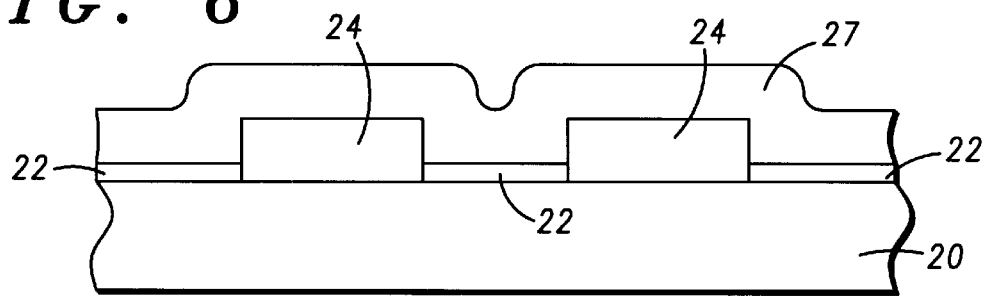
Figure 7:
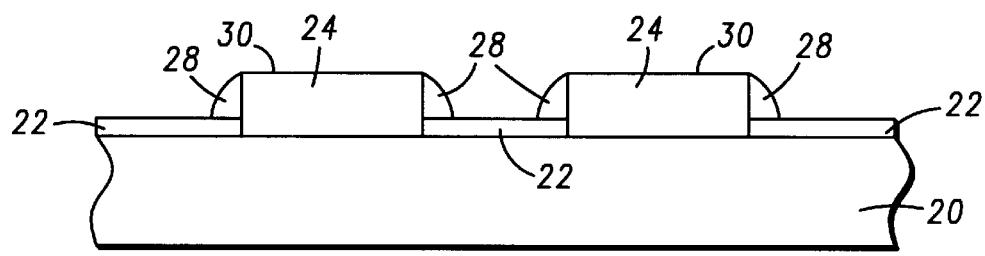

Referring now to FIGS. 5–8, sequential steps in a metallization process in accordance with another method of the present invention are illustrated. Referring specifically to FIG. 5 a mask layer 22 is grown on unmasked portions of a surface 21 of a substrate 20 to define contact areas. A layer 24 of a compound, including a metal, is selectively deposited on surface 21 on the contact areas as illustrated in FIG. 6. Still referring to FIG. 6, sidewalls are formed in a well known manner. A blanket layer 27 of an insulating material is deposited over the substrate and layers 24. Using well known etching techniques layer 27 of the insulating material is partially removed leaving sidewalls 28, as shown in FIG. 6. Because, as explained previously, the dissociation of the compound begins at its exposed surfaces, sidewalls 28 insure that only an upper surface 30 is exposed.

Figure 8:
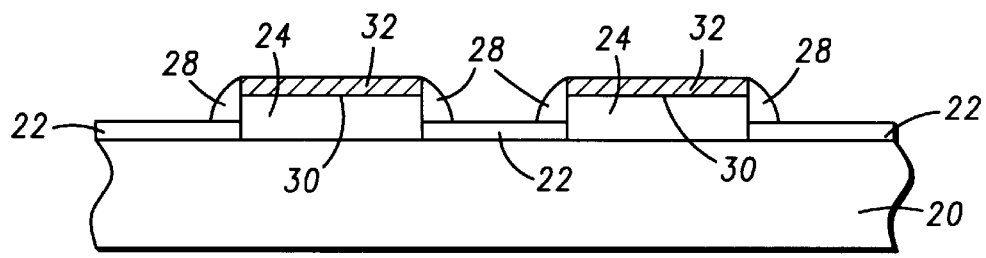

Turning to FIG. 8, the compound is heated to the congruent sublimation temperature. This dissociates the compound to selectively form a layer 32 of the metal at surfaces 30. Alternatively, layer 24 can be formed of a semiconductor material which does not dissociate. In this case, layer 32 can be formed by depositing the compound on surface 30, which compound is then dissociated.

In another embodiment, layer 32 can be formed by utilizing a gaseous metal which dissociates under a dissociation temperature to leave layer 32 of metal only on surface 30. The dissociation and application of the dissociation temperature occurs during deposition of the compound, which in this embodiment includes a gaseous metal, to selectively form layer 32 of the metal on surface 30. In a specific example the gaseous metal includes trimethyl indium, trimethyl amine alane, etc. Substrate structure 20 is heated to a temperature of greater than 500° C. when trimethyl indium is the compound and to a temperature of greater than 930° C. for trimethyl amine alane. The gaseous metal dissociates upon contacting the exposed heated surface 30 with only layer 32 of the metal remaining.

Figure 9:
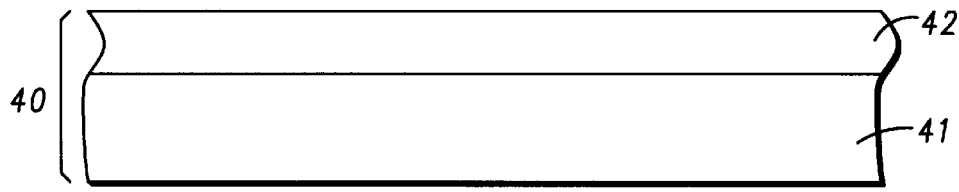
FIGS. 9 through 11 are simplified sectional views illustrating several sequential steps in another process in accordance with the present invention.
Figure 10:
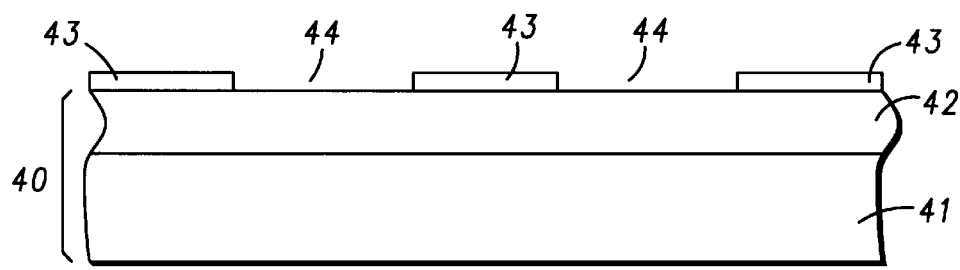
Figure 11:
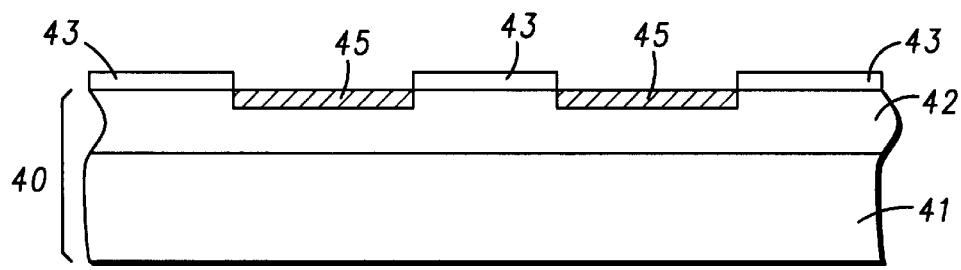

Referring to FIGS. 9–11, sequential steps in a metallization process in accordance with another method of the present invention are illustrated. Referring specifically to FIG. 9, a substrate structure 40 is illustrated including a supporting substrate 41 and an epi layer 42 grown thereon. As previously described, a mask 43 is formed on the surface of layer 42 by any convenient technique, but by preferably using a resistless process. It should be understood that while mask 43 is preferably an oxide mask fabricated by a resistless process, other masks such as nitrides can be employed. Mask 43 defines metallization areas 44.

Turning to FIG. 11, assuming that layer 42 includes a compound which dissociates under certain predetermined conditions, metallization is accomplished by applying the predetermined conditions to form metal layer 45. In a specific example, layer 42 includes one of InAs, InP, InGaAs, and AlAs and substrate structure 40 is heated to a congruent sublimation temperature such as greater than 420° C. for InAs, InP and InGaAs, and greater than 930° C. for AlAs.

Figure 12:
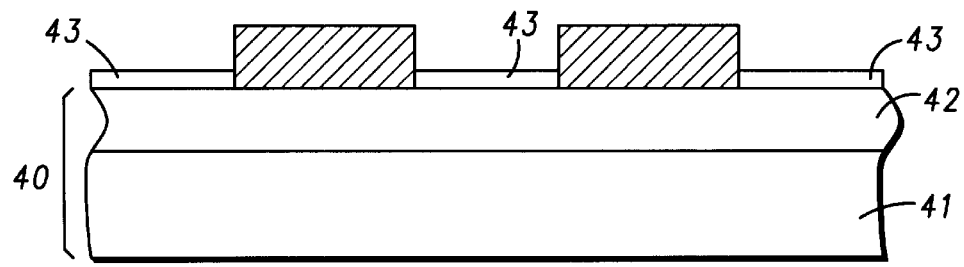
FIG. 12 illustrates a variation on the process of FIGS. 9 through 11.

Alternatively, metal layer 45 can be formed by selectively depositing a compound, which dissociates, in metallization areas 44, which compound is then dissociated, as illustrated in FIG. 12. In a variation, metal layer 45 can be formed by utilizing a gaseous metal which dissociates under a dissociation temperature to leave metal layer 45 only in metallization area 44. The dissociation and application of the dissociation temperature occurs during deposition of the compound, which in this embodiment includes a gaseous metal, to selectively form metal layer 45 in metallization area 44.

Accordingly, improved metallization processes have been provided for selective metallization during semiconductor device fabrication. The new selective metallization process during the fabrication of semiconductor devices does not require removal of the substrate from the processing chamber and can be used in combination with resistless processes. Because metal can be selectively deposited in accordance with the present invention substantial reduction in process steps and improvement in devices is realized. Further, the metallization, once accomplished, can be used as a diffusion source for the doping of underlying components.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of selective metallization/deposition to form a metal contact comprising the steps of:
    providing a substrate structure having a surface;
    positioning a mask on the surface of the substrate thereby defining a plurality of contact areas on the surface of the substrate beneath the mask and a plurality of unmasked areas;
    selectively growing a mask layer on the unmasked areas of the surface of the substrate;
    selectively removing the mask to expose the plurality of contact areas; and
    selectively forming a metal on the plurality of contact areas.

2. A method as claimed in claim 1 including a step of diffusing the metal into the contact areas after the step of selectively forming the metal on the contact areas.

3. A method of selective metallization/deposition to form a metal contact comprising the steps of:
    providing a substrate structure having a surface;
    positioning a mask on the surface of the substrate thereby defining a plurality of contact areas on the surface of the substrate beneath the mask and a plurality of unmasked areas;
    selectively growing a mask layer on the unmasked areas of the surface of the substrate;
    selectively removing the mask to expose the contact areas; and selectively depositing a compound, including a metal, which dissociates under a dissociation temperature, the dissociation and application of the dissociation temperature occurring one of during deposition or after deposition to selectively leave remaining a layer of a metal on the contact areas.

4. A method as claimed in claim 3 wherein the step of selectively growing a mask layer includes employing a resistless process to form an oxide mask layer.

5. A method as claimed in claim 4 wherein the step of selectively depositing a compound is performed in situ.

6. A method as claimed in claim 5 wherein the step of selectively depositing a compound includes utilizing a gaseous metal which dissociates to leave a layer of metal only on the contact area of the substrate surface.

7. A method as claimed in claim 6 wherein the step of selectively depositing a compound includes utilizing trimethyl indium.

8. A method as claimed in claim 7 wherein the dissociation temperature includes heating the substrate to a temperature greater than 500° C.

9. A method as claimed in claim 6 wherein the step of selectively depositing a compound includes utilizing trimethyl amine alane.

10. A method as claimed in claim 9 wherein the dissociation temperature includes heating the substrate to a temperature greater than 930° C.

11. A method as claimed in claim 10 wherein the step of selectively depositing a compound includes selectively growing the compound on the contact area and heating the compound to the congruent sublimation temperature of the compound.

12. A method as claimed in claim 10 wherein the substrate structure includes a layer of the compound grown prior to the step of patterning the mask layer and the patterning step is performed on the layer of the compound.

13. A method as claimed in claim 3 further including selecting the compound from a group including: InAs, InP, InGaAs, and AIAs.

14. A method as claimed in claim 13 wherein the compound includes one of InAs, InGaAs and InP and the dissociation temperature includes heating the compound to a temperature greater than 420° C.

15. A method as claimed in claim 13 wherein the compound includes AIAs and the dissociation temperature includes heating the compound to a temperature greater than 930° C.

16. A method as claimed in claim 3 including a step of diffusing the layer of the metal into the substrate structure.

17. A method of selective metallization/deposition comprising the steps of:
    providing a substrate structure having a surface;
    positioning a mask on the surface of the substrate thereby defining a plurality of contact areas on the surface of the substrate beneath the mask and a plurality of unmasked areas;
    selectively growing a mask layer on the unmasked areas of the surface of the substrate;
    selectively removing the mask to expose the contact areas; and
    selectively depositing a gaseous metal which dissociates under a dissociation temperature to leave a layer of metal only on the contact area of the substrate surface, the dissociation and application of the dissociation temperature occurring during deposition to selectively form a layer of the metal on the contact areas.

18. A method as claimed in claim 17 wherein the step of selectively depositing a gaseous metal includes depositing trimethyl indium.

19. A method as claimed in claim 18 wherein the dissociation temperature includes heating the substrate to a temperature greater than 500° C.

20. A method as claimed in claim 17 wherein the step of selectively depositing a gaseous metal includes depositing trimethyl amine alane.

21. A method as claimed in claim 20 wherein the dissociation temperature includes heating the substrate to a temperature greater than 930° C.

22. A method of selective metallization/deposition comprising the steps of:
    providing a substrate structure having a surface;
    growing a layer of a compound including a metal on the surface of the substrate;
    positioning a mask on the layer of the compound including a metal which dissociates under a congruent sublimation temperature thereby defining a plurality of contact areas beneath the mask and a plurality of unmasked areas;
    selectively growing a mask layer on the unmasked areas of the compound including a metal;

selectively removing the mask to expose the contact areas; and heating the compound including a metal to the congruent sublimation temperature to selectively leave remaining only a layer of the metal in the contact areas.

23. A method as claimed in claim 22 wherein the substrate structure includes selectively depositing a layer of the compound including a metal in the contact areas prior to heating the compound to the congruent sublimation temperature.

24. A method as claimed in claim 22 further including selecting the compound from a group including: InAs, InP, InGaAs, and AlAs.

25. A method as claimed in claim 24 wherein the compound includes one of InAs, InGaAs and InP and the congruent sublimation temperature include heating the compound to a temperature greater than 420° C.

26. A method as claimed in claim 24 wherein the compound includes AlAs and the congruent sublimation temperature include heating the compound to a temperature greater than 930° C.

27. A method as claimed in claim 22 wherein the step of selectively depositing a compound and heating the compound to the congruent sublimation temperature is performed simultaneously.

* * * * *